(12) United States Patent
Wang et al.

(10) Patent No.: US 8,294,802 B2
(45) Date of Patent: Oct. 23, 2012

(54) CCD IMAGE SENSORS HAVING MULTIPLE LATERAL OVERFLOW DRAIN REGIONS FOR A HORIZONTAL SHIFT REGISTER

(75) Inventors: Shen Wang, Webster, NY (US); Xueyuan Liu, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 357 days.

(21) Appl. No.: 12/609,029

(22) Filed: Oct. 30, 2009

(65) Prior Publication Data

US 2011/0102658 A1    May 5, 2011

(51) Int. Cl.
*H04N 3/14* (2006.01)
(52) U.S. Cl. ......... 348/314; 348/294; 348/311; 257/230
(58) Field of Classification Search ............... 348/294, 348/311, 314, 315
See application file for complete search history.

(56) References Cited

U.S. PATENT DOCUMENTS

| | | | |
|---|---|---|---|
| 5,130,774 A * | 7/1992 | Stevens et al. | 257/445 |
| 5,902,995 A | 5/1999 | Morimoto | |
| 2010/0302427 A1* | 12/2010 | Wang et al. | 348/311 |

FOREIGN PATENT DOCUMENTS

| | | |
|---|---|---|
| EP | 0 509 456 A1 | 10/1992 |
| EP | 1 137 070 A2 | 9/2001 |

* cited by examiner

*Primary Examiner* — Chieh M Fan
*Assistant Examiner* — Dwight C Tejano
(74) *Attorney, Agent, or Firm* — Bingham McCutchen LLP

(57) ABSTRACT

A charge-coupled device (CCD) image sensor includes a layer of a semiconductor material having a first conductivity type. A horizontal CCD channel region of a second conductivity type is disposed in the layer of the semiconductor material. The horizontal CCD channel region includes multiple phases that are used to shift photo-generated charge through the horizontal CCD channel region. Distinct overflow drain regions are disposed in the layer of semiconducting material, with an overflow drain region electrically connected to only one particular phase of the horizontal CCD channel region.

12 Claims, 6 Drawing Sheets

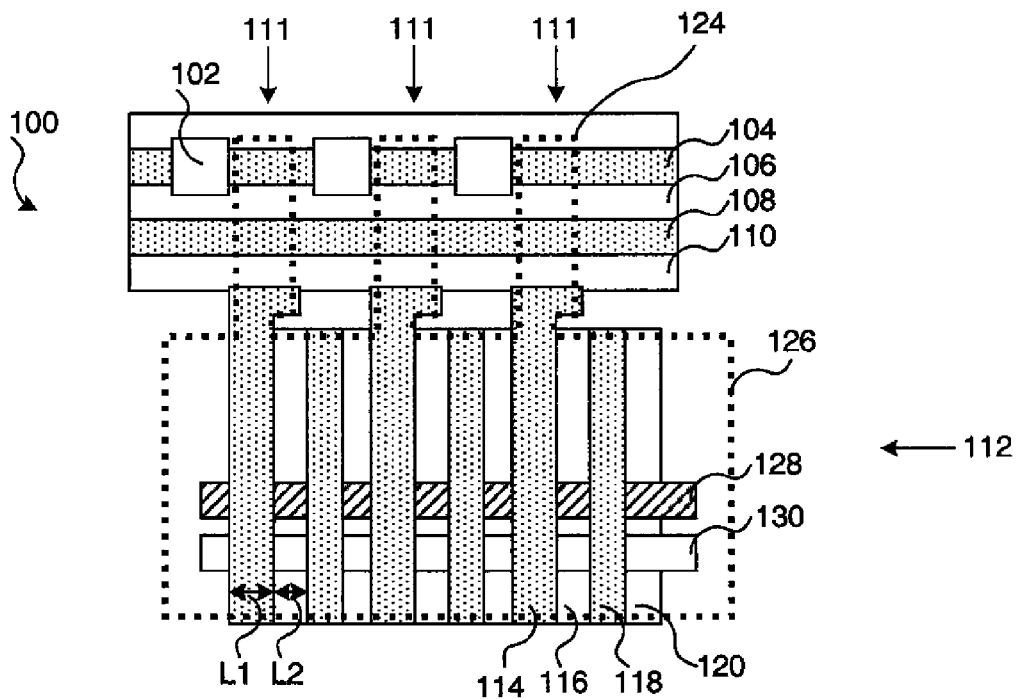
FIG. 1 - Prior Art
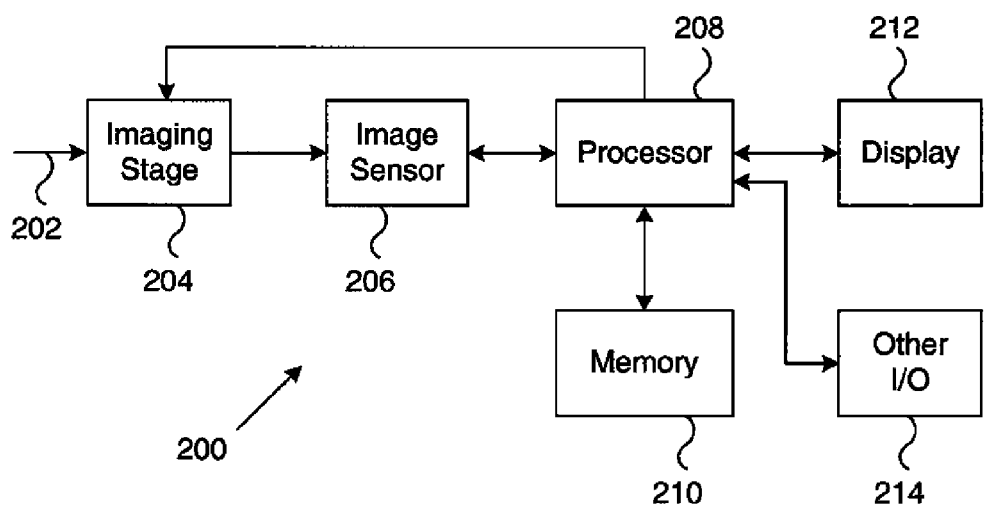
FIG. 2

CCD IMAGE SENSORS HAVING MULTIPLE LATERAL OVERFLOW DRAIN REGIONS FOR A HORIZONTAL SHIFT REGISTER

CROSS-REFERENCE TO RELATED APPLICATION

This application is related to U.S. patent application Ser. No. 12/475,825 filed on Jun. 1, 2009.

TECHNICAL FIELD

The present invention relates generally to image sensors for use in digital cameras and other types of image capture devices, and more particularly to image sensors having multiple lateral overflow drain structures for a horizontal shift register.

BACKGROUND

Photodetectors, vertical shift registers, and horizontal shift registers all have a maximum amount of photo-generated charge each can store. Excess charge spills or "blooms" into neighboring components when the photo-generated charge exceeds the maximum amount. Blooming is a serious problem in image sensors because blooming corrupts the image output from the image sensor.

A camera having an image sensor operating in either a sub-sampling mode or a focus mode can transfer excess photo-generated charge to a horizontal shift register. A sub-sampling mode enables a camera to operate with a fast frame rate having less resolution, such as a video preview mode. For example, a "5x" sub-sampling in the y-direction reads out only one line out of every five lines. The image sensor inside the camera dumps four successive lines of charge from the vertical shift registers into the horizontal shift register and removes the charge from the horizontal shift register before the transfer of the fifth line of charge. If the amount of photo-generated charge in the four lines of charge exceeds the capacity of the horizontal shift register, the excess charge spills back into the vertical shift registers and creates a "blooming" image.

A focus-mode enables the image sensor to read out only a portion of the image by dumping the leading and trailing portions of the image. The leading or the trailing portions can include many lines of charge. Blooming occurs when the total amount of charge dumped into the horizontal shift register exceeds the capacity of the horizontal shift register. Blooming corrupts the image and adversely affects the auto-focusing functionality of the camera.

U.S. Pat. No. 5,902,995 discloses a solution to the problem of blooming in the horizontal shift register. FIG. 1 depicts a top view of a portion of an image sensor disclosed in U.S. Pat. No. 5,902,995. Image sensor 100 has array of photodetectors 102 that convert incident light into photo-generated charge. Each pixel has four vertical gates 104, 106, 108, 110 that are used to shift photo-generated charge through the vertical shift register regions 111. Each horizontal shift register region 112 also has four gates 114, 116, 118, 120 that are used to sequentially shift the photo-generated charge through the horizontal shift register region.

Photo-generated charge that is transferred to the vertical shift register regions 111 is shifted vertically down through a channel 124 in each vertical shift register region 111, and then transferred to the horizontal shift register region 112. An overflow barrier region 128 extends across and is embedded below channel 126. An overflow drain region 130 is connected to channel 126 of horizontal shift register region 112. Overflow drain region 130 discharges any excess charge that exceeds the barrier potential.

However, due to relatively high sheet resistance of overflow drain region 130, having a long stripe of an overflow drain region 130 extending across the entire horizontal shift register region 112 produces a voltage drop from the center of the stripe to the point where the stripe has a conductive contact that connects to a power supply. This voltage drop degrades the effectiveness of the overflow drain performance.

To overcome the drop in voltage, the overflow drain under each horizontal gate should be connected to a metal bus to eliminate the voltage drop caused by the conductive contact. However, this solution is not feasible when the length of a horizontal gate (L1 or L2) is too small to accommodate a conductive contact.

SUMMARY

A charge-coupled device (CCD) image sensor includes a layer of a semiconductor material of one conductivity type and having a surface. A horizontal CCD channel region of the opposite conductivity type is disposed adjacent to the surface of the layer of the semiconductor material. The horizontal CCD channel region includes a plurality of phases that is used to shift photo-generated charge through the horizontal CCD channel region. Distinct overflow drain regions are disposed in the layer of semiconducting material, with an overflow drain region electrically connected to at least one particular phase of the horizontal CCD channel region. Channel stop regions of the first conductivity type are disposed in the layer of the semiconductor material adjacent to the surface and adjacent to areas of the horizontal CCD channel region electrically connected to each overflow drain. A width of each area of the horizontal CCD channel region electrically connected to the overflow drains is constructed such that a barrier region containing dopants diffused from adjacent channel stop regions is formed in said areas of the horizontal CCD channel region. Each barrier region is located between each overflow drain and the one particular phase electrically connected to the drain.

ADVANTAGEOUS EFFECTS

The present invention can reduce or prevent blooming in horizontal CCD channel regions. The present invention can reduce the vertical size of an image sensor. The smaller size of the image sensor reduces the costs to manufacture the image sensor. Furthermore, the present invention can be used to reduce the "pull-down" effect of channel potential in an overflow bather region, thereby making the overflow barrier region electrically more stable.

BRIEF DESCRIPTION OF THE DRAWINGS

Embodiments of the invention are better understood with reference to the following drawings. The elements of the drawings are not necessarily to scale relative to each other.

FIG. 1 is a top view of a portion of a prior art image sensor;

FIG. 2 is a simplified block diagram of an image capture device in an embodiment in accordance with the invention;

DETAILED DESCRIPTION

Figure 3:
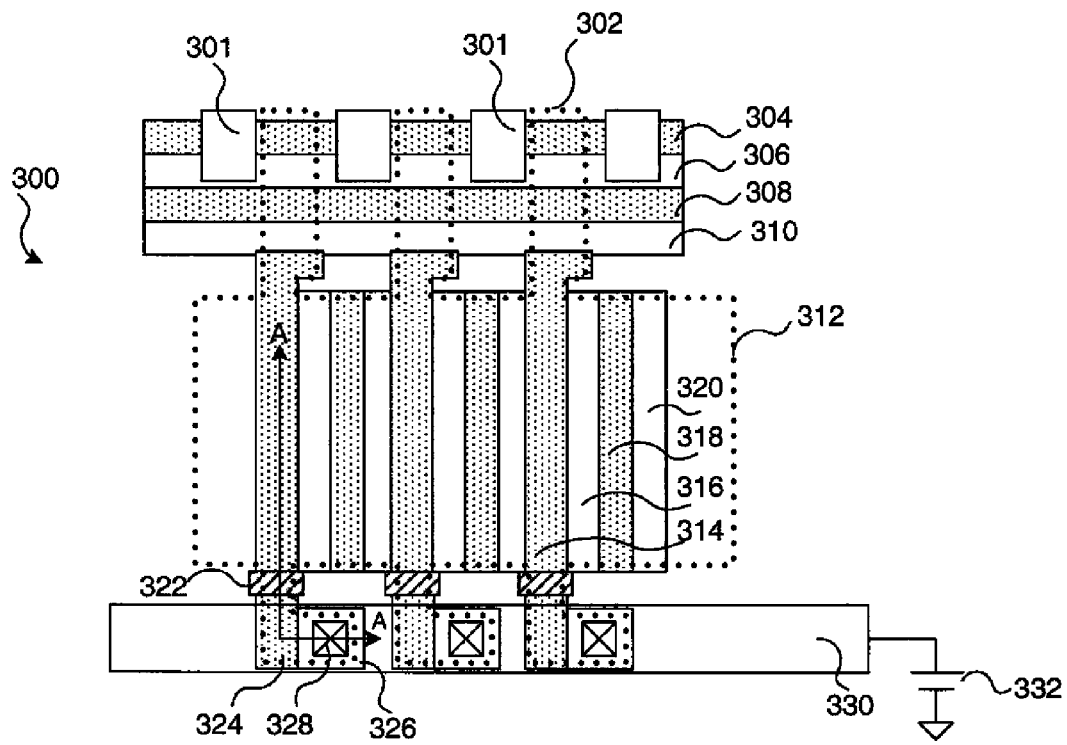
FIG. 3 is a simplified top view of a first image sensor suitable for use as image sensor 206 shown in FIG. 2 in an embodiment in accordance with the invention.

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

And finally, the terms "wafer" and "substrate" are to be understood as a semiconductor-based material including, but not limited to, silicon, silicon-on-insulator (SOI) technology, doped and undoped semiconductors, epitaxial layers formed on a semiconductor substrate, and other semiconductor structures.

Referring to the drawings, like numbers indicate like parts throughout the views.

FIG. 2 is a simplified block diagram of an image capture device in an embodiment in accordance with the invention. Image capture device 200 is implemented as a digital camera in FIG. 3. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In digital camera 200, light 202 from a subject scene is input to an imaging stage 204. Imaging stage 204 can include conventional elements such as a lens, a neutral density filter, an iris and a shutter. Light 202 is focused by imaging stage 204 to form an image on image sensor 206. Image sensor 206 captures one or more images by converting the incident light into electrical signals. Image sensor 206 is implemented as a Charge-Coupled Device (CCD) image sensor in the embodiment shown in FIG. 2.

Digital camera 200 further includes processor 208, memory 210, display 212, and one or more additional input/output (I/O) elements 214. Although shown as separate elements in the embodiment of FIG. 2, imaging stage 204 may be integrated with image sensor 206, and possibly one or more additional elements of digital camera 200, to form a compact camera module.

Processor 208 may be implemented, for example, as a microprocessor, a central processing unit (CPU), an application-specific integrated circuit (ASIC), a digital signal processor (DSP), or other processing device, or combinations of multiple such devices. Various elements of imaging stage 204 and image sensor 206 may be controlled by timing signals or other signals supplied from processor 208.

Memory 210 may be configured as any type of memory, such as, for example, random access memory (RAM), read-only memory (ROM), Flash memory, disk-based memory, removable memory, or other types of storage elements, in any combination. A given image captured by image sensor 206 may be stored by processor 208 in memory 210 and presented on display 212. Display 212 is typically an active matrix color liquid crystal display (LCD), although other types of displays may be used. The additional I/O elements 214 may include, for example, various on-screen controls, buttons or other user interfaces, network interfaces, or memory card interfaces.

It is to be appreciated that the digital camera shown in FIG. 2 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Referring now to FIG. 3, there is shown a simplified top view of a first image sensor suitable for use as image sensor 206 shown in FIG. 2 in an embodiment in accordance with the invention. Image sensor 300 has array of pixels with each pixel including a photodetector 301 to convert incident light into photo-generated charge. For simplicity, only a portion of the last row of pixels in the array is shown in FIG. 3.

A vertical gate 304, 306, 308, 310 is disposed over each phase (not shown) of vertical CCD channel region 302. Gates 304 and 308 are made by a first layer of conductive material, such as, for example, a polysilicon material. Gates 306 and 310 are made by a second layer of conductive material.

Horizontal CCD channel region 312 also has four gates 314, 316, 318, 320. Each gate 314, 316, 318, 320 is disposed over a phase (not shown in FIG. 3) of horizontal CCD channel 312. Horizontal gates 314 and 318 are made by the first conductive material and horizontal gates 316 and 320 are made by the second conductive material.

Figure 4:
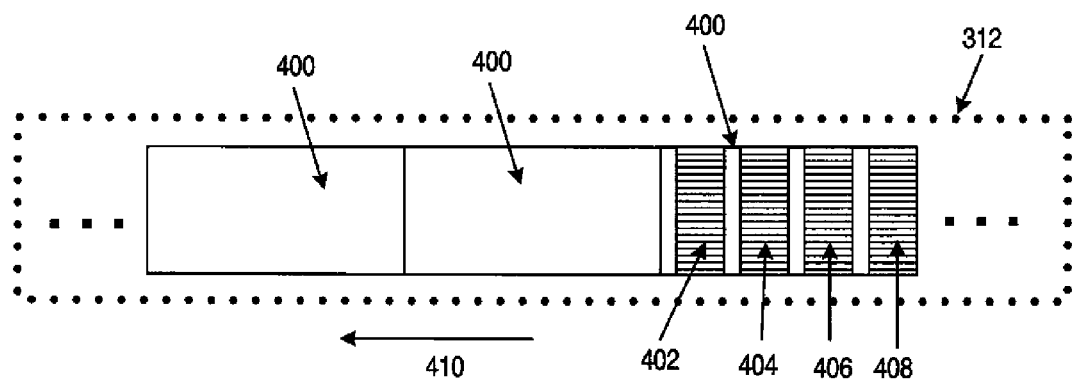
FIG. 4 is a simplified diagram of four phases that may be included in vertical CCD channel region 302 in an embodiment in accordance with the invention.

FIG. 4 is a simplified diagram of four phases that can be used in horizontal CCD channel region 312 in an embodiment in accordance with the invention. Other embodiments in accordance with the invention can employ any number of phases in a horizontal CCD channel region, such as, for example, two or more phases.

When a horizontal CCD channel region is configured as a multi-phase structure, each shift element 400 in the horizontal CCD channel region is separated into multiple parts or "phases." The phases facilitate the transfer of charge through the structures. Thus, in a four-phase CCD, each shift element 400 has a first phase 402, a second phase 404, a third phase 406, and a fourth phase 408. Horizontal gate 314 (FIG. 3) is disposed over first phase 402, horizontal gate 316 over second phase 404, horizontal gate 318 over third phase 406, and horizontal gate 320 over fourth phase 408. Arrow 410 represents the direction photo-generated charge is shifted through horizontal CCD channel region 312 in an embodiment in accordance with the invention.

Referring again to FIG. 3, after the photodetectors 301 convert incident light into photo-generated charge, the photo-generated charge is transferred from the photodetectors 301 to the first phase in each vertical CCD channel region 310. The charge is then shifted down through the phases of vertical CCD channel region 302 by selectively applying clock signals to vertical gates 304, 306, 308, 310.

The last phase of vertical CCD channel region 302 transfers the photo-generated charge into horizontal CCD channel region 312. Clocking signals are then selectively applied to horizontal gates 314, 316, 318, 320 to sequentially shift the photo-generated charge through the phases 402, 404, 406, 408 (FIG. 4) in horizontal CCD channel region 312.

An overflow bather region 322 is disposed adjacent to only one phase in horizontal CCD channel region 312. In the embodiment shown in FIG. 3, overflow bather region 322 is adjacent to the phase that receives the photo-generated charge from vertical CCD channel region 302. Other embodiments in accordance with the invention can place overflow barrier region 322 adjacent to another phase in horizontal CCD channel region 312.

A buffer region 324 is disposed adjacent to each bather region 322. An overflow drain 326 is formed sideways or laterally adjacent to each buffer region 324. A conductive contact 328 connects each overflow drain region 326 to a conductive bus 330. Conductive bus 330 is implemented as a metal bus in an embodiment in accordance with the invention. Examples of metal materials that can be used for conductive bus 330 include, but are not limited to, aluminum and copper. Conductive bus 330 can be formed with a different conductive material in another embodiment in accordance with the invention.

Conductive bus 330 connects to a power supply bias 332. Power supply bias 332 is implemented as a DC bias in the embodiment shown in FIG. 3. Other embodiments in accordance with the invention can configure power supply bias using different components or circuits. For example, power supply bias 332 can be connected to an existing DC bias, such as the drain of a reset transistor or the output amplifier supply VDD.

When the photo-generated charge does not exceed the charge capacity of one or more phases in horizontal CCD channel region 312, the photo-generated charge is shifted through horizontal CCD channel region 312 by applying clock signals to horizontal gates 314, 316, 318, 320. However, if the photo-generated charge exceeds the capacity of the phase clocked by horizontal gate 314, as can happen when image sensor 300 is operating in either a sub-sampling or a focus mode, the excess charge will flow over overflow barrier region 322, pass through buffer region 324, and be drained away by overflow drain region 326.

Connecting conductive contact 328 to the conductive bus 330 at only one of every four horizontal gates eliminates the voltage drop problem experienced by prior art image sensors. Also, unlike the prior art in which the overflow drain region is placed under each horizontal gate, the overflow drain region is connected to only one of the four phases, thereby enabling conductive contact 328 to be placed between conductive bus 330 and overflow drain region 326. In addition, each overflow drain region can be placed sideways or laterally adjacent to each buffer region 324, thereby reducing the vertical size of image sensor 300. The smaller size of image sensor 300 results in less manufacturing costs. Furthermore, the buffer region 324 can be used to reduce the "pull-down" effect of channel potential in overflow barrier region 322 by the overflow drain region 326, thereby making overflow barrier region 322 more stable.

Figure 5:
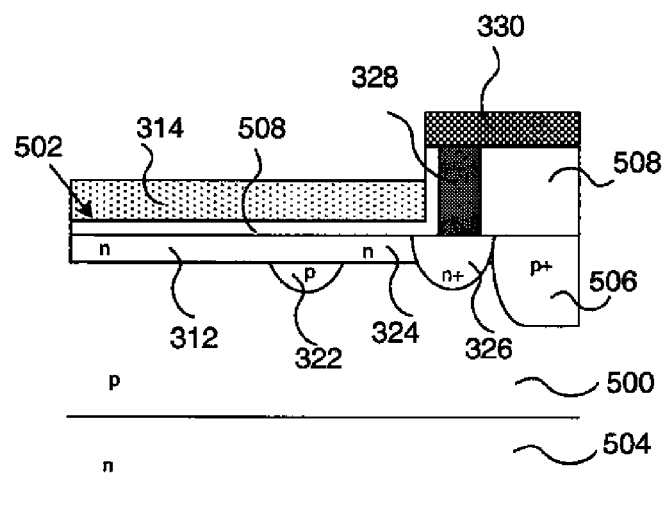
FIG. 5 is a cross-sectional view along line A-A shown in FIG. 3.

FIG. 5 is a cross-sectional view along line A-A shown in FIG. 3. Some of the elements shown in FIG. 5 are described herein as having specific conductivity types. Other embodiments in accordance with the invention are not limited to these conductivity types. For example, all of the conductivity types may be reversed in another embodiment in accordance with the invention.

Figure 6:
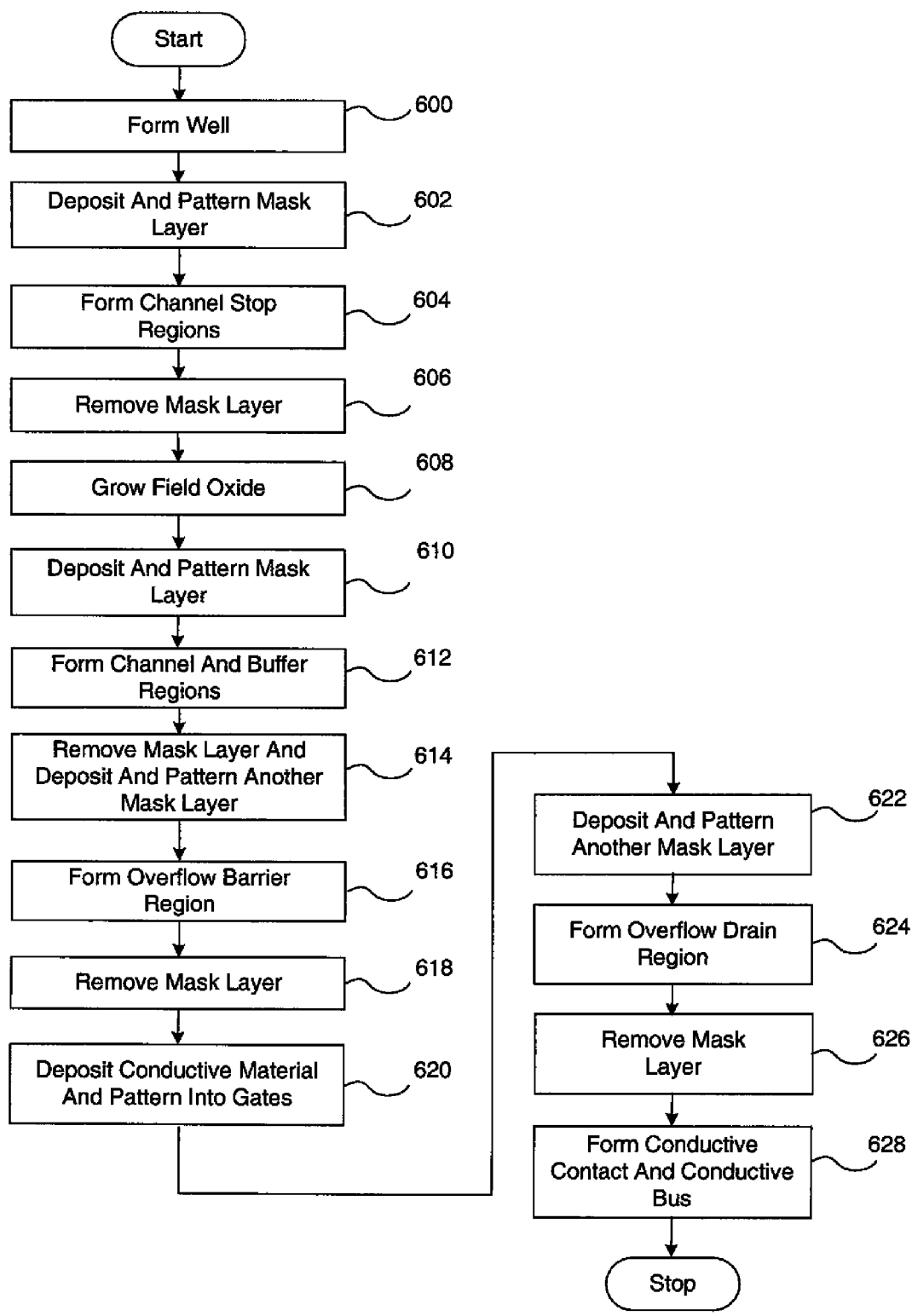
FIG. 6 is a flowchart of a method for forming the structure shown in FIG. 5 in an embodiment in accordance with the invention.

FIG. 5 will be described in conjunction with FIG. 6. FIG. 6 is a flowchart of a method for forming the structure shown in FIG. 5 in an embodiment in accordance with the invention. Boron is an example of a dopant having a p conductivity type that can be used to form the p conductivity type structures. Phosphorus and arsenic are exemplary dopants having an n conductivity type that can be used to form the n conductivity type structures.

A well 500 having a surface 502 is formed by implanting one or more dopants having a p conductivity type into substrate 504 having an n conductivity type (block 600 in FIG. 6). Well 500 is continuous, uninterrupted, and spans the area in the image sensor that includes all of the photodetectors, vertical CCD channel regions, and horizontal CCD channel region in an embodiment in accordance with the invention. Well 500 and substrate 504 each comprise a layer of semiconductor material.

A mask layer (not shown) is then deposited and patterned and channel stop region 506 formed adjacent to surface 502 (blocks 602, 604 in FIG. 6). Channel stop region 506 is created by implanting at least one dopant having a p+ conductivity type into well 500. By way of example only, boron dopants having a concentration of $1 \times 10^{13}$ atoms per square centimeter are implanted into well 500 to form channel stop region 506. After channel stop region 506 is formed, the mask layer is removed, as shown in block 606 in FIG. 6.

Field oxide 508 is then grown at block 608 (FIG. 6) to form an isolation region. Different types of isolation regions can be used in other embodiments in accordance with the invention.

Another mask layer (not shown) is then deposited and patterned at block 610 in FIG. 6, and one or more dopants having an n conductivity type are implanted into well 500 to form horizontal CCD channel region 312 and buffer region 324 (block 612 in FIG. 6). Next, as shown in block 614 in FIG. 6, the masking layer is removed and another masking layer (not shown) deposited and patterned over the image sensor. Overflow barrier region 322 is then formed by implanting at least one dopant having a p conductivity type into well 500 (block 616 in FIG. 6). Overflow barrier region 322 is embedded in, or wholly contained within, well 500. Overflow barrier region 322 is also disposed below horizontal gate 314. By way of example only, boron dopants having a concentration of $1 \times 10^{12}$ atoms per square centimeter are implanted into well 500 to form overflow barrier region 322.

The mask layer is then removed at block 618 in FIG. 6, and the first conductive material deposited and patterned over horizontal CCD channel region 312 to form horizontal gates 314, 318 (gate 318 not shown in FIG. 5) (block 620 in FIG. 6). Next, the second conductive material is deposited and patterned to form horizontal gates 316, 320 (gates not shown in FIG. 5) (block 620). A polysilicon material is used as the first and second conductive materials in an embodiment in accordance with the invention.

A masking layer is then deposited and patterned over the image sensor (not shown) and overflow drain region 326 formed adjacent to surface 502 by implanting one or more dopants having an n+conductivity type into well 500 (blocks 622, 624 in FIG. 6). Conductive contact 328 is formed and connected to conductive bus 330. Conductive contact 328 and conductive bus 330 are formed by depositing and patterning metal layers in an embodiment in accordance with the invention (block 626 in FIG. 6). Finally, conductive bus 330 is connected to a power supply bias (e.g., 332 in FIG. 3) to set the potential of overflow drain region 326.

Figure 7:
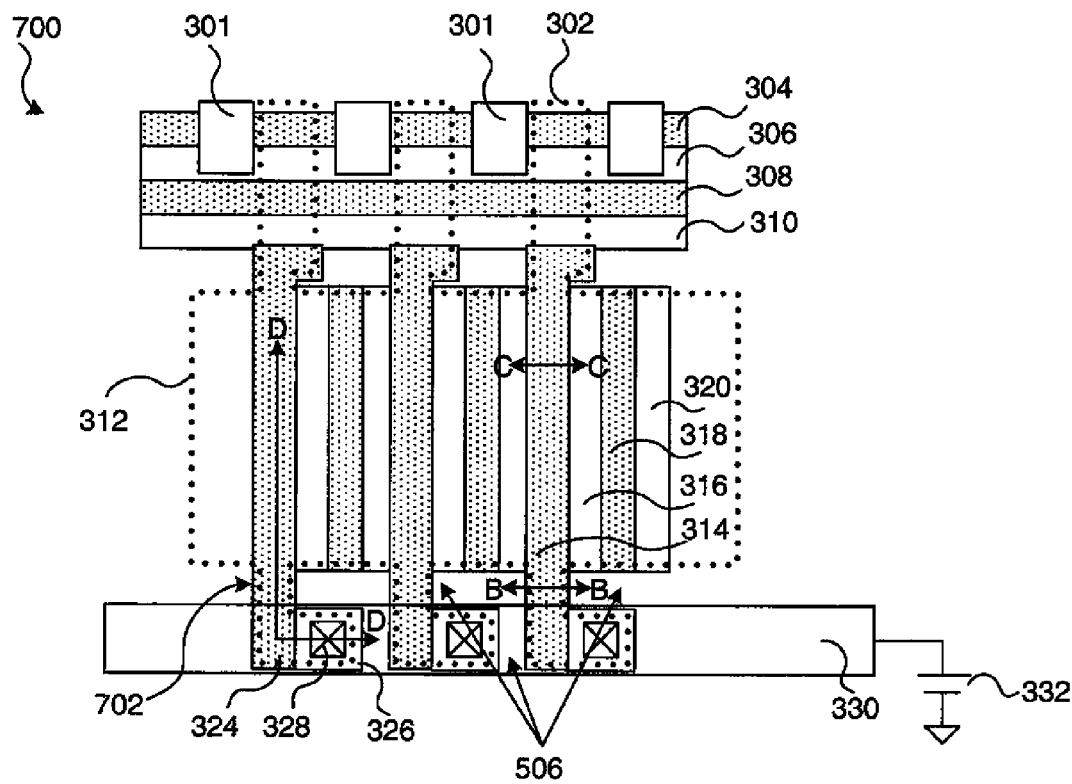
FIG. 7 is a simplified top view of a second image sensor suitable for use as image sensor 206 shown in FIG. 2 in an embodiment in accordance with the invention.

Referring now to FIG. 7, there is shown a simplified top view of a second image sensor suitable for use as image sensor 206 shown in FIG. 2 in an embodiment in accordance with the invention. Some of the elements shown in FIG. 7 are described herein as having specific conductivity types. Other embodiments in accordance with the invention are not limited to these conductivity types. For example, all of the conductivity types may be reversed in another embodiment in accordance with the invention.

Image sensor 700 in FIG. 7 is identical to image sensor 300 in FIG. 3, except that image sensor 700 does not include implanted overflow bather region 322. Instead, area 702 in horizontal CCD channel region 312 is configured as a narrow channel through the channel stop regions 506. The width of the narrow channel allows an overflow bather region (not shown in FIG. 7; see 802 in FIGS. 8 and 10) to form during subsequent fabrication steps. The implanted dopants that create channel stop regions 506 laterally diffuse around area 702 during subsequent processing of the image sensor. The diffused dopants cause the electrical potential in area 702 to decrease compared to the electrical potential of the horizontal CCD channel region 312 under gates 314, 316, 318, 320 in an embodiment in accordance with the invention. In another embodiment in accordance with the invention, where the conductivity types are reversed from those shown in FIG. 7, the diffused dopants cause the electrical potential to increase in area 702.

The decreased electrical potential in area 702 and the overflow barrier region containing diffused dopants act as a bather that limits the flow of charge carriers to overflow drain region 326. Thus, a narrow channel in area 702 can substitute for an implanted overflow bather region.

Figure 8:
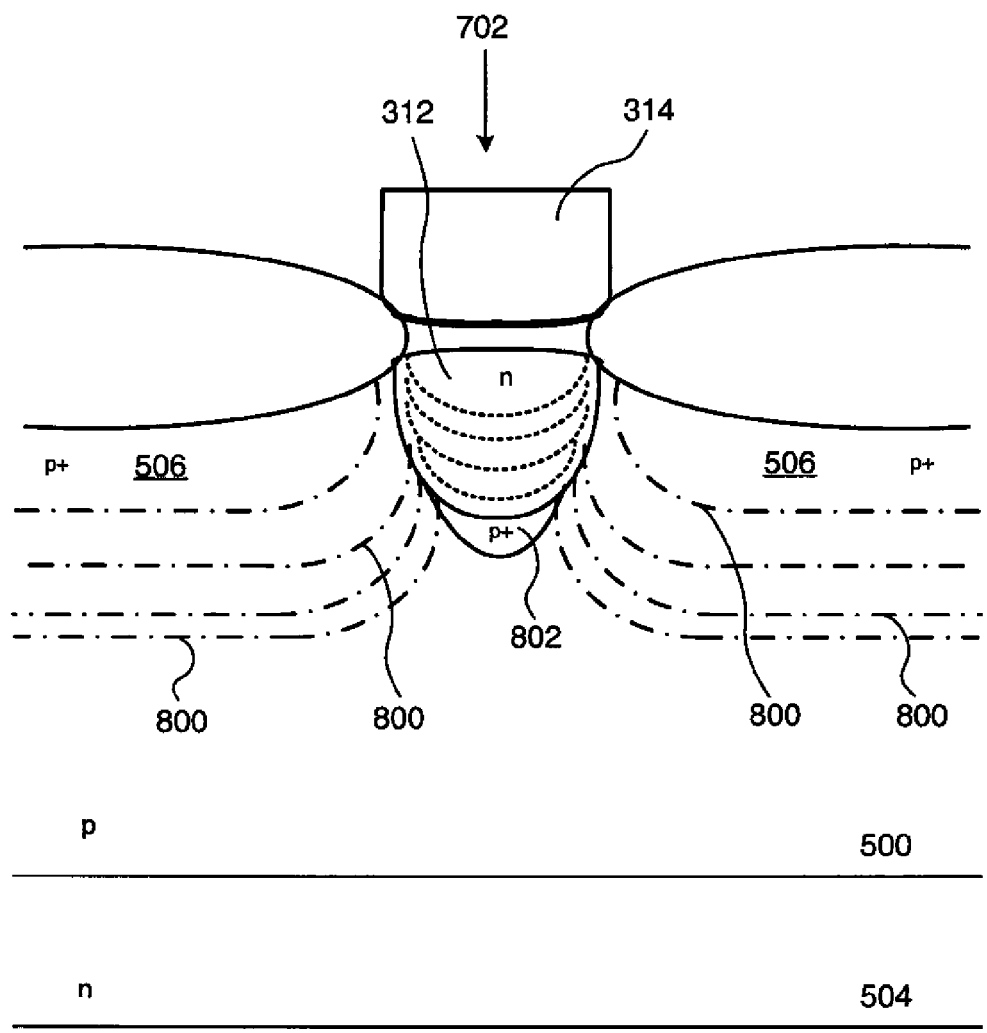
FIG. 8 is a cross-sectional view along line B-B of horizontal CCD channel region 312 shown in FIG. 7.

As described, the decreased channel potential in area 702 is caused by dopants under channel stop regions 506 laterally diffusing into area 702 from both sides. FIG. 8 is a cross-sectional view along line B-B of horizontal CCD channel region 312 shown in FIG. 7. Profiles 800 illustrate the dopant concentrations in well 500. Regions in and below channel stops 506 are usually heavily doped with one or more dopants having a p-type conductivity in the FIG. 8 embodiment. During fabrication of the image sensor, the p-type dopants under the channel stops 506 diffuse laterally into area 702 in horizontal CCD channel region 312 and form overflow barrier region 802. As shown by the dopant profiles in FIG. 8, the dopants from channel stop region 506 press against CCD channel region 312, causing the width of CCD channel region 312 in area 702 to narrow. The diffused dopants in area 702 decrease the electrical potential of area 702 because the diffused dopants reduce the size and constrict the shape of area 702.

Figure 9:
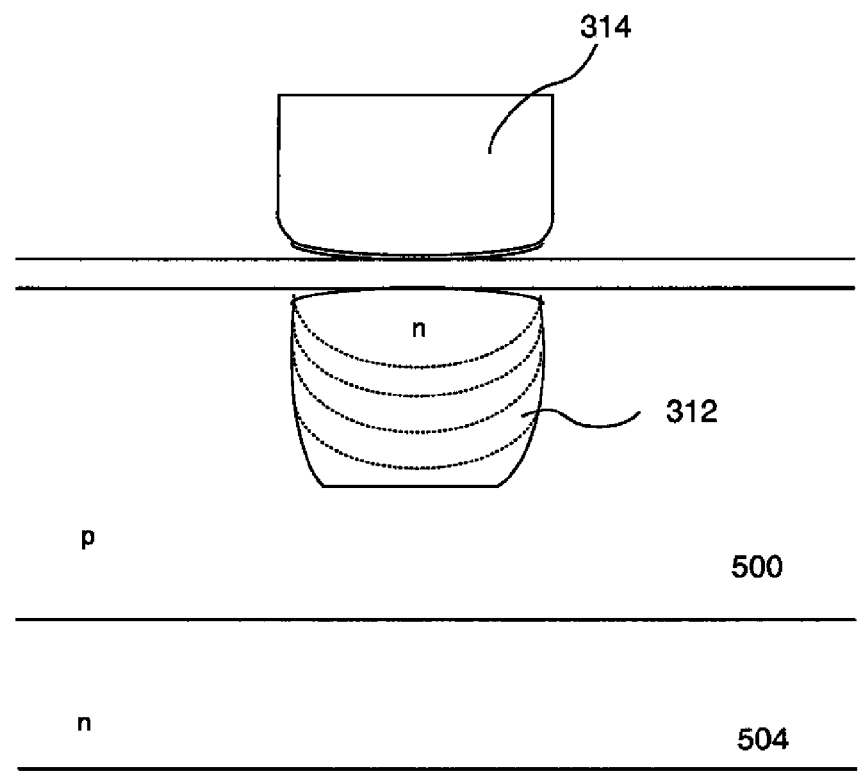
FIG. 9 is a cross-sectional view along line C-C of horizontal CCD channel region 312 shown in FIG. 7.

The narrowing of area 702 is particularly noticeable when comparing FIG. 8 with FIG. 9. FIG. 9 is a cross-sectional view along line C-C of horizontal CCD channel region 312 shown in FIG. 7. The shape of horizontal CCD channel region 312 in FIG. 9 is more rectangular compared to the more rounded shape in FIG. 8. The size of horizontal CCD channel region 312 in FIG. 9 is larger than the size of horizontal CCD channel region 312 in FIG. 8. As discussed earlier, the reduced size and constricted shape of area 702 produces the decreased electrical potential in area 702.

Figure 10:
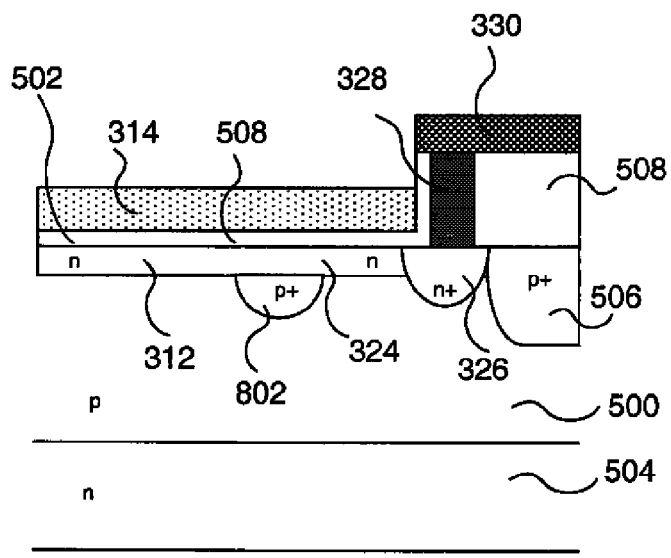
FIG. 10 is a cross-sectional view along line D-D shown in FIG. 7.

Referring now to FIG. 10, there is shown a cross-sectional view along line D-D shown in FIG. 7. FIG. 10 is identical to FIG. 5 except that in the FIG. 10 embodiment, the overflow drain barrier region 802 is created by the lateral diffusion of p-type dopants under the channel stop regions 506 (above and below the paper surface). In the FIG. 5 embodiment, the overflow drain barrier region 322 is created by implanting dopants into well 500.

When fabricating the structure shown in FIG. 10, the narrow channel in area 702 eliminates a masking step and a dopant implantation step. Instead, the width of area 702 is designed to allow for the formation of an overflow bather region 802 via dopants diffusing from under channel stop regions 506. Fabrication of the FIG. 10 structure would follow the flowchart shown in FIG. 6, except that blocks 614 and 616 are not performed. Thus, one advantage to the use of a narrow channel in area 702 is the elimination of a masking procedure and a dopant implantation step. Eliminating blocks 614 and 616 reduces the cost and complexity of the fabrication process.

The invention has been described in detail with particular reference to certain preferred embodiments thereof, but it will be understood that variations and modifications can be effected within the spirit and scope of the invention. For example, the embodiments described herein employ only one horizontal CCD channel region in an image sensor. Other embodiments in accordance with the invention can use two or more horizontal CCD channel regions. The horizontal CCD channel region or regions can be positioned at any location around the array of pixels. And the horizontal CCD channel region or regions can be uni-directional and transfer photo-generated charge in only one direction, or bi-directional and simultaneously transfer photo-generated charge in two opposite directions.

Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image sensor
102 photodetector
104 vertical gate
106 vertical gate
108 vertical gate
110 vertical gate
111 vertical shift register region
112 horizontal shift register region
114 horizontal gate
116 horizontal gate
118 horizontal gate
120 horizontal gate
124 channel in vertical shift register region
126 channel in horizontal shift register region
128 overflow barrier region
130 overflow drain region 200 image capture device
202 light
204 imaging stage
206 image sensor
208 processor
210 memory
212 display
214 other I/0
300 image sensor
301 photodetector
302 vertical CCD channel region
304 vertical gate
306 vertical gate
308 vertical gate
310 vertical gate
312 horizontal CCD channel region
314 horizontal gate
316 horizontal gate
318 horizontal gate
320 horizontal gate
322 overflow barrier region
324 buffer region
326 overflow drain region
328 conductive contact
330 conductive bus
332 power supply bias
400 shift element
402 first phase
404 second phase
406 third phase
408 fourth phase
410 arrow representing direction of charge transfer
500 well
502 surface of well
504 substrate
506 channel stop region
508 field oxide
700 image sensor
702 area
800 dopant profiles
802 overflow barrier region

The invention claimed is:

1. A charge-coupled device (CCD) image sensor comprising:
an array of pixels each comprising a photodectector for conversion of incident light into electrical charge;
electrically connected to the array of pixels, a horizontal CCD channel region comprising a plurality of shift elements for receiving change from the array of pixels and transferring the charge out of the array for conversion into an image each shift element comprising a plurality of phases; and
associated with each shift element, a distinct overflow drain electrically connected to only one phase of the shift element, the phase being a drainable phase comprising (i) a first region proximate the array of pixels and (ii) a second region proximate the overflow drain,
wherein a channel width of the drainable phase in the second region is narrower than a channel width of the drainable phase in the first region, the narrower channel width in the second region forming a potential barrier having a height selected to prevent charge blooming from the drainable phase into a component other than the overflow drain to which the drainable phase is connected.

2. The CCD image sensor of claim 1, further comprising a plurality of channel stop regions adjoining the second region of the drainable phase.

3. The CCD image sensor of claim 2, wherein the narrower channel width in the second region is defined at least in part by dopants laterally diffused from the channel stop regions adjoining the second region.

4. The CCD image sensor of claim 1, further comprising a conductive bus electrically connected to all of the distinct overflow drains.

5. The CCD image sensor of claim 4, wherein the conductive bus comprises a metal.

6. The CCD image sensor of claim 5, wherein the metal comprises at least one of aluminum or copper.

7. The CCD image sensor of claim 4, further comprising a source of power supply bias electrically connected to the conductive bus.

8. The CCD image sensor of claim 1, further comprising, for transferring charge from the pixels to the horizontal CCD channel region, a plurality of vertical CCD channel regions each electrically connected to (i) a plurality of pixels and (ii) the horizontal CCD channel region.

9. The CCD image sensor of claim 8, wherein each vertical CCD channel region comprises a plurality of phases, one of the phases being directly connected to the horizontal CCD channel region.

10. The CCD image sensor of claim 9, wherein, for each of the vertical CCD channel regions, the phase of the vertical CCD channel region directly connected to the horizontal CCD channel region is connected to the drainable phase of the horizontal CCD channel region.

11. The CCD image sensor of claim 9, further comprising, electrically connected to the horizontal CCD channel region, circuitry for conversion of charge received from the horizontal CCD channel region into an image.

12. The CCD image sensor of claim 11, wherein the circuitry comprises an output amplifier.

* * * * *

UNITED STATES PATENT AND TRADEMARK OFFICE
CERTIFICATE OF CORRECTION

| | | |
|---|---|---|
| PATENT NO. | : 8,294,802 B2 | Page 1 of 1 |
| APPLICATION NO. | : 12/609029 | |
| DATED | : October 23, 2012 | |
| INVENTOR(S) | : Wang et al. | |

It is certified that error appears in the above-identified patent and that said Letters Patent is hereby corrected as shown below:

Column 10:
In claim 2, line 14, delete "a plurality of".

Column 10:
In claim 11, line 45, delete "9" and replace with --1--.

Signed and Sealed this
Fifteenth Day of January, 2013

David J. Kappos
*Director of the United States Patent and Trademark Office*